(12) United States Patent
Chang

(10) Patent No.: US 11,575,072 B2
(45) Date of Patent: Feb. 7, 2023

(54) DISPLAY DEVICE

(71) Applicant: E Ink Holdings Inc., Hsinchu (TW)

(72) Inventor: Chien-Hsing Chang, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 17/149,758

(22) Filed: Jan. 15, 2021

(65) Prior Publication Data

US 2021/0305462 A1 Sep. 30, 2021

(30) Foreign Application Priority Data

Mar. 30, 2020 (TW) .................................. 109110738

(51) Int. Cl.
*H01L 33/46* (2010.01)
*H01L 27/15* (2006.01)

(52) U.S. Cl.
CPC ............ *H01L 33/46* (2013.01); *H01L 27/156* (2013.01)

(58) Field of Classification Search
None
See application file for complete search history.

(56) References Cited

U.S. PATENT DOCUMENTS

| | | | |
|---|---|---|---|
| 6,959,025 B2 | 10/2005 | Jikutani et al. | |
| 6,975,663 B2 | 12/2005 | Sekiya et al. | |
| 7,245,647 B2 | 7/2007 | Jikutani et al. | |
| 7,648,849 B2 | 1/2010 | Lee et al. | |
| 7,693,204 B2 | 4/2010 | Sato et al. | |
| 8,699,540 B2 | 4/2014 | Sato | |
| 10,903,460 B2* | 1/2021 | Kishimoto | .......... H01L 51/0097 |
| 2015/0380439 A1* | 12/2015 | Chen | ................... H01L 27/1222 257/72 |
| 2019/0179190 A1* | 6/2019 | Chen | ................. G02F 1/133305 |

FOREIGN PATENT DOCUMENTS

| | | |
|---|---|---|
| CN | 102013414 A | 4/2011 |
| TW | I593153 B | 7/2017 |

OTHER PUBLICATIONS

Corresponding Taiwan office action dated Nov. 26, 2020.

* cited by examiner

*Primary Examiner* — Robert K Carpenter
(74) *Attorney, Agent, or Firm* — CKC & Partners Co., LLC

(57) ABSTRACT

A display device includes a pixel array, at least one flexible substrate, and at least one optical blocking layer. The flexible substrate is located below the pixel array. The optical blocking layer is located between the flexible substrate and the pixel array. The optical blocking layer includes a first sub-layer and a second sub-layer. The first sub-layer is located between the second sub-layer and the flexible substrate, and a refractive index of the first sub-layer is different from a refractive index of the second sub-layer.

10 Claims, 4 Drawing Sheets

DISPLAY DEVICE

CROSS-REFERENCE TO RELATED APPLICATION

This application claims priority to Taiwan Application Serial Number 109110738, filed Mar. 30, 2020, which is herein incorporated by reference in its entirety.

BACKGROUND

Field of Invention

The present invention relates to a display device. More particularly, the present invention relates to a flexible display device.

Description of Related Art

During the fabrication process of a flexible display device, the bonding strength between a flexible substrate and a glass substrate is weakened by a laser light L, such that the flexible substrate is separated from the glass substrate. However, the laser light may lighten a pixel array due to defects in the flexible substrate, and the pixel array may be damaged. Therefore, it is still a development direction for the industry to provide a display device that can prevent the pixel array from being lightened by the laser light.

SUMMARY

One aspect of the present disclosure is a display device.

In some embodiments, the display device includes a pixel array, at least one flexible substrate, and at least one optical blocking layer. The flexible substrate is located below the pixel array. The optical blocking layer is located between the flexible substrate and the pixel array. The optical blocking layer includes a first sub-layer and a second sub-layer. The first sub-layer is located between the second sub-layer and the flexible substrate, and a refractive index of the first sub-layer is different from a refractive index of the second sub-layer.

In some embodiments, an orthogonal projection of the optical blocking layer on the flexible substrate is overlapped with the entirety of an orthogonal projection of the pixel array on the flexible substrate.

In some embodiments, the optical blocking layer covers the entirety of the flexible substrate.

In some embodiments, the optical blocking layer is directly in contact with the flexible substrate.

In some embodiments, the display device of claim 1 includes a steam blocking layer located between the pixel array and the optical blocking layer, and the optical blocking layer covers the entirety of a bottom surface of the steam blocking layer.

In some embodiments, an orthogonal projection of the optical blocking layer on the flexible substrate is overlapped with the entirety of an orthogonal projection of the steam blocking layer on the flexible substrate.

In some embodiments, a number of the flexible substrates is two, and the display device further includes a steam blocking layer located between the pixel array and one of the two flexible substrates, and the two flexible substrates are respectively located at two opposite sides of the optical blocking layer.

In some embodiments, an orthogonal projection of the optical blocking layer on the another flexible substrate is overlapped with the entirety of an orthogonal projection of the flexible substrate located between the steam blocking layer and the optical blocking layer on the another flexible substrate.

In some embodiments, an orthogonal projection of the optical blocking layer on the another flexible substrate is overlapped with the entirety of an orthogonal projection of the steam blocking layer on the another flexible substrate.

In some embodiments, the optical blocking layer includes a plurality of first sub-layers and a plurality of second sub-layers, and the first sub-layers and the second sub-layers are alternately arranged.

In the aforementioned embodiments, since the optical blocking layer includes the first sub-layer and the second sub-layer with different refractive index, the optical blocking layer may have high reflective rate. Therefore, through disposing an optical blocking layer with higher refractive index between the pixel array and the flexible substrate, the array pixel may be prevented from being damaged by the laser light when the flexible substrate and the glass substrate are separated through the laser light.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
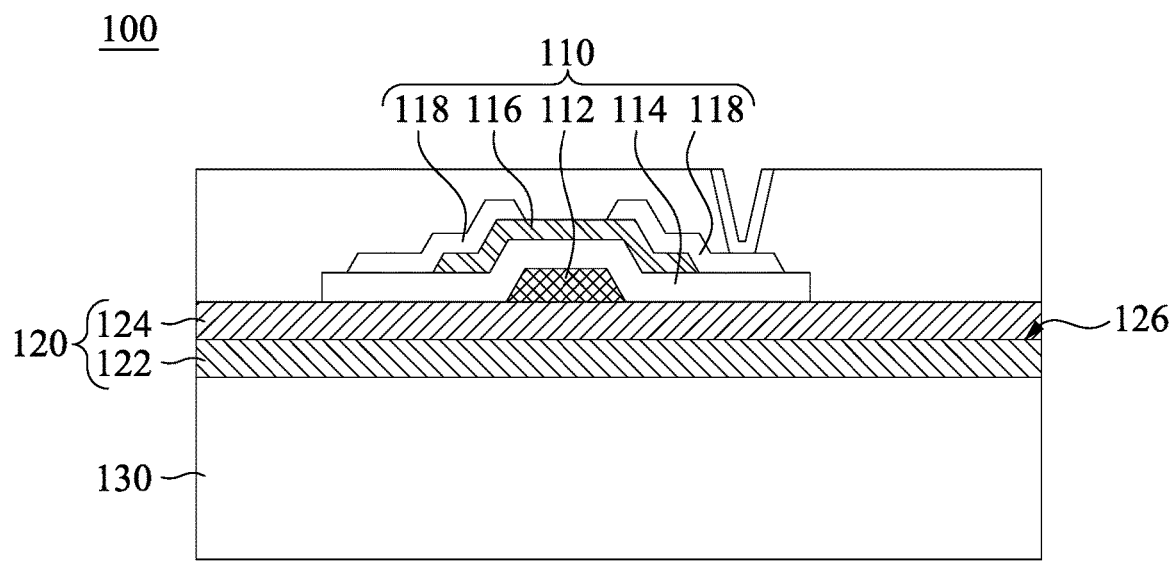
FIG. 1 is a cross-sectional view of a display device according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of a display device 100 according to one embodiment of the present disclosure. The display device 100 includes a pixel array 110, an optical blocking layer 120, and a flexible substrate 120. The flexible substrate 130 is located below the pixel array 110 and the optical blocking layer 120. The optical blocking layer 120 is located between the flexible substrate 130 and the pixel array 110. That is, the flexible substrate 130 is located at a side of the optical blocking layer 120 facing away from the pixel array 110. The optical blocking layer 120 includes a first sub-layer 122 and a second sub-layer 124. The first sub-layer 122 is located between the second sub-layer 124 and the flexible substrate 130, and a refractive index of the first sub-layer 122 is different from a refractive index of the second sub-layer 124. In other words, the layer with a smaller refractive index is located at a side close to the flexible substrate 130.

In the present embodiment, a material of the flexible substrate 130 may include polyimide (PI), and the display device 100 is flexible. A thickness of the flexible substrate 130 may be in a range from about 5 micrometers to 45 micrometers, but the present disclosure is not limited in this regard.

The optical blocking layer 120 may be designed based on a theory of a distributed Bragg Reflector (DBR). For example, in the present embodiment, a material of the first sub-layer 122 is Silicon Dioxide ($SiO_2$), and the refractive index of the first sub-layer 122 is in a range from about 1.45 to 1.6. A material of the second sub-layer 124 is Titanium Dioxide ($TiO_2$), and the refractive index of the second sub-layer 124 is in a range from about 2.4 to 2.7. The materials and refractive index of the first sub-layer 122 and the second sub-layer 124 are merely an example, and the present disclosure is not limited in this regard. The light may be reflected by the interface 126 between the first sub-layer 122 and the second sub-layer 124 of the optical blocking layer 120 through the difference of the refractive index between the first sub-layer 122 and the second sub-layer 124. The reflective rate of the interface 126 is determined by the difference of the refractive index between the first sub-layer 122 and the second sub-layer 124 so as to enhance the reflective rate of the entire optical blocking layer 120. As such, by disposing the optical blocking layer 120 with high reflective rate between the flexible substrate 130 and the pixel array 110, the optical blocking layer 120 may reflect the light from a side where the flexible substrate 130 is located so as to protect the pixel array 110 overlying the optical blocking layer 120.

In some embodiment, the materials of the first sub-layer 122 and the second sub-layer 124 may respectively be Silicon Oxide and Niobium(V) Oxide ($Nb_2O_5$). A refractive index of the Niobium(V) Oxide is in a range from about 2.5 to 3. In some embodiments, the material for the first sub-layer 122 with a lower refractive index may include dielectric material for optical coating with low refractive index such as Magnesium Fluoride ($MgF_2$) or Calcium Fluoride ($CaF_2$), but the present disclosure is not limited in this regard. The material for the second sub-layer 124 with a higher refractive index may include dielectric material for optical coating with high refractive index such as Zinc Selenide (ZnSe), Silicon Nitride ($Si_3N_4$), and Tantalum Pentoxide ($Ta_2O_5$), but the present disclosure is not limited in this regard. Specifically, the material of the first sub-layer 122 and the second sub-layer 124 are required to be transparent and be light permeable, and the refractive index of the first sub-layer 122 is smaller than the refractive index of the second sub-layer 124. The first sub-layer 122 and the second sub-layer 124 with the materials above may be formed through sputtering and vapor deposition.

In some embodiments, the materials of the first sub-layer 122 and the second sub-layer 124 may be semi-conductor material such as Gallium Arsenide (GaAs) or Aluminum Arsenide (AlAs), but the present disclosure is not limited in this regard. It is merely required that the material of the first sub-layer 122 and the second sub-layer 124 are transparent and be light permeable. The first sub-layer 122 and the second sub-layer 124 including semi-conductor material may be formed through epitaxial process.

In the present embodiment, the pixel array 110 includes an active device. The active device includes a gate electrode 112, a dielectric layer 114, a channel layer 116, a source/drain 118, but the present disclosure is not limited in this regard. One active device is illustrated in FIG. 1 as an example.

Figure 2:
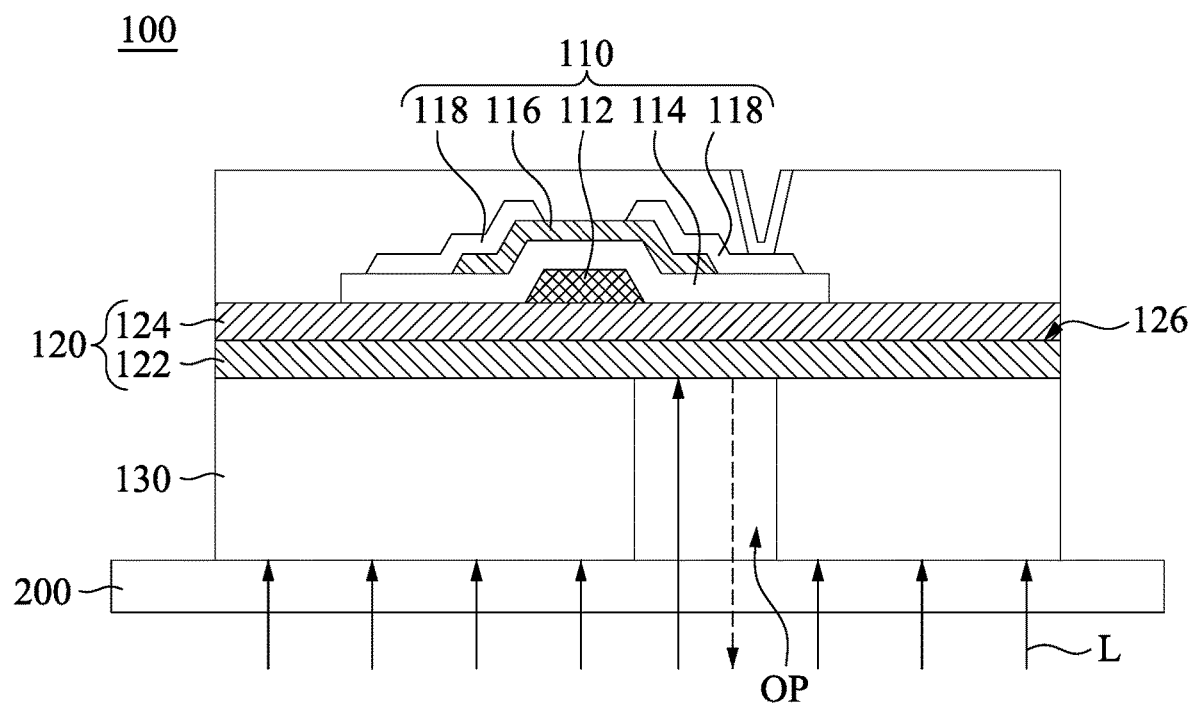
FIG. 2 is a cross-sectional view of the display device in FIG. 1 in the middle stage of the fabrication process.

FIG. 2 is a cross-sectional view of the display device 100 in FIG. 1 in the middle stage of the fabrication process. Specifically, as shown in FIG. 2, the flexible substrate 130 is formed on a glass substrate 200 when fabricating the display device 100. Subsequently, the bonding strength between the flexible substrate 130 and the glass substrate 200 is weakened by a laser light L after the pixel array 110 is formed on the flexible substrate 130, such that the flexible substrate 130 is separated from the glass substrate 200.

As shown in FIG. 2, in some embodiment, the flexible substrate 130 may have defects such as bubble or foreign body, an opening OP is demonstrated herein. When the flexible substrate 130 is about to be separated from the glass substrate 200, the laser light L may transmit the opening OP and transformed to the pixel array 110. Therefore, the pixel array 110 can be prevented from damage due to being lightened by the laser light L through disposing the optical blocking layer 120 with high reflective rate, thereby enhance yield of the display device 100.

In the present embodiment, the wavelength of the laser light L is 308 nanometers, but the present embodiment is not limited in this regard. In some embodiments, thickness of the first sub-layer 122 and the second sub-layer 124 of the optical blocking layer 120 satisfy the design rule of ¼ optical wavelength thickness. That is, the value of ¼ of the wavelength of the laser light L divided by the refractive index. With such design, the optical blocking layer 120 with high reflecting rate for specific wavelength can be formed.

In addition, as shown in FIG. 1, since there is a greater refractive index difference between the air (refractive index is 1.0) in the opening OP and the first sub-layer 122 when the opening OP exists in the flexible substrate 130, the laser light L may be reflected by disposing the second sub-layer 124 with high refractive index between the first sub-layer 122 with low refractive index and the flexible substrate 130. Therefore, in the embodiment as shown in FIG. 1, except for the interface 126, the interface between the first sub-layer 122 and the opening OP may reflect the laser light L. As such, the pixel array 110 can be prevented from damage due to being lightened by the laser light L through disposing the optical blocking layer 120 with high reflective rate, thereby enhance yield of the display device 100.

In some embodiments, an orthogonal projection of the optical blocking layer 120 on the flexible substrate 130 is overlapped with the entire orthogonal projection of the pixel array 110 on the flexible substrate 130. In other words, the range of the optical blocking layer 120 is greater than or equal to the range of the entire pixel array 110, such that the pixel array 110 may be prevented from being damaged by the laser light L.

In some embodiments, the optical blocking layer 120 covers the entire flexible substrate 130. In other words, the width of the optical blocking layer 120 is greater than or equal to the width of the flexible substrate 130. As such, if there is defects in the range of the flexible substrate 130 that may be lightened by the laser light L, the optical blocking layer 120 overlying the flexible substrate 130 may reflect the laser light L so as to prevent the pixel array 110 from being damaged.

In some embodiments, the optical blocking layer 120 is directly in contact with the flexible substrate 130. For example, as described above, the first sub-layer 122 and the second sub-layer 124 may be formed by sputtering dielectric material or depositing semi-conductor material on the flexible substrate 130. As such, the optical blocking layer 120 and the flexible substrate 130 can be considered as a substrate with high reflective rate.

Figure 3:
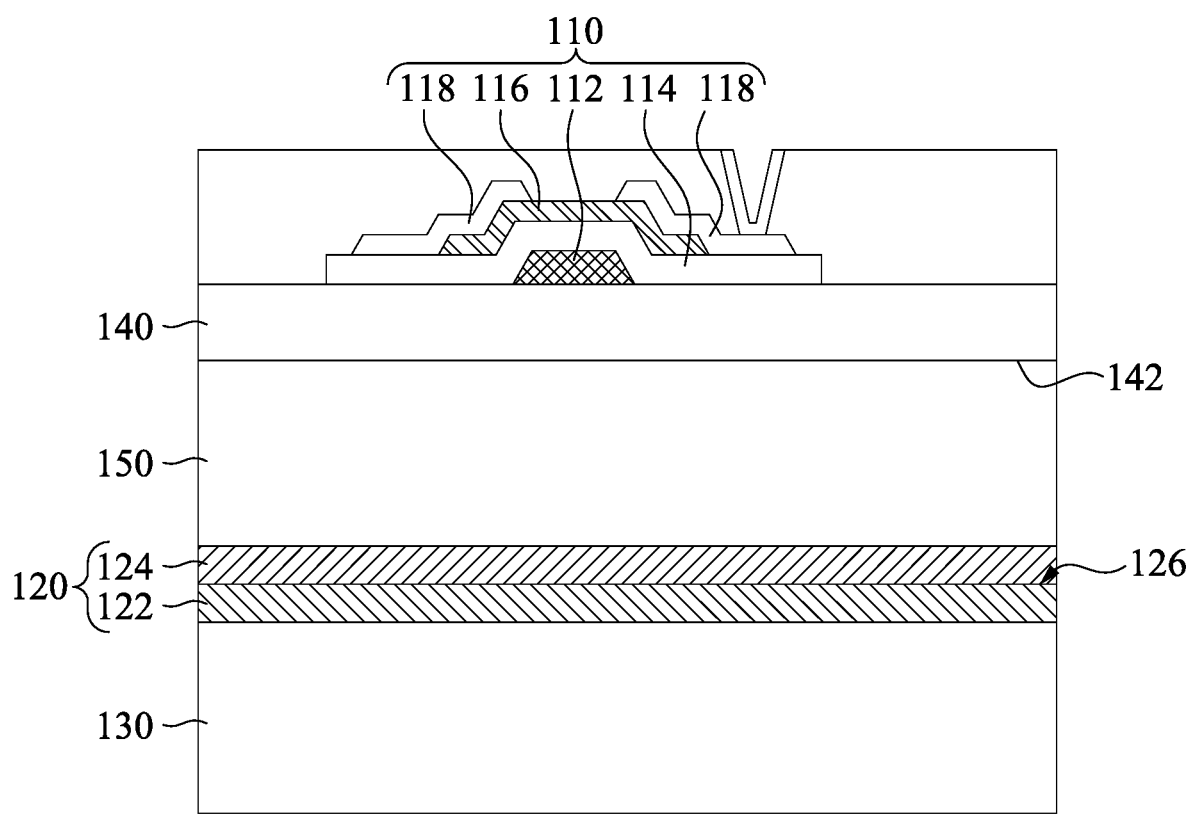
FIG. 3 is a cross-sectional view of a display device according to another embodiment of the present disclosure.

FIG. 3 is a cross-sectional view of a display device 100a according to another embodiment of the present disclosure. The display device 100a is substantially the same as the display device 100, the difference is that the display device 100a further includes steam blocking layer 140 and another flexible substrate 150.

The steam blocking layer 140 is located between the pixel array 110 and the optical blocking layer 120, and the steam blocking layer 140 cannot reflect or block the laser light L. In other words, the steam blocking layer 140 and the pixel array 110 can be protected by disposing the optical blocking layer 120 at a side of the steam blocking layer 140 facing away from the pixel array 110. In some embodiments, the optical blocking layer 120 covers the entire bottom surface 142 of the steam blocking layer 140. In other words, the orthogonal projection of the optical blocking layer 120 on the flexible substrate 130 is overlapped with the entire orthogonal projection of the steam blocking layer 140 on the flexible substrate 130. That is, the range of the optical blocking layer 120 is required to be greater than or equal to the range of the entire steam blocking layer 140. As such, the entire steam blocking layer 140 can be protected by the optical blocking layer 120 such that the pixel array 110 can be prevented from being lightened by the laser light L.

The flexible substrate 150 is located at a side of the optical blocking layer 120 facing away from the flexible substrate 130. The flexible substrate 130 and the flexible substrate 150 are respectively located at two opposite sides of the optical blocking layer 120. In other words, the flexible substrate 130, 150, and the two optical blocking layers 120 are alternately arranged. An orthogonal projection of the optical blocking layers 120 on the flexible substrate 130 is overlapped with the entire orthogonal projection of the flexible substrate 150 on the flexible substrate 130. An orthogonal projection of the optical blocking layers 120 on the flexible substrate 130 is overlapped with the entire orthogonal projection of the steam blocking layer 140 on the flexible substrate 130. In other words, the range of the optical blocking layers 120 is required to be greater than or equal to the ranges of the entire flexible substrate 150 and the entire steam blocking layer 140. As such, the entire flexible substrate 130 and the entire steam blocking layer 140 can be protected by the optical blocking layer 120 such that the pixel array 110 can be prevented from being lightened by the laser light L, thereby enhance yield of the display device 100.

Figure 4:
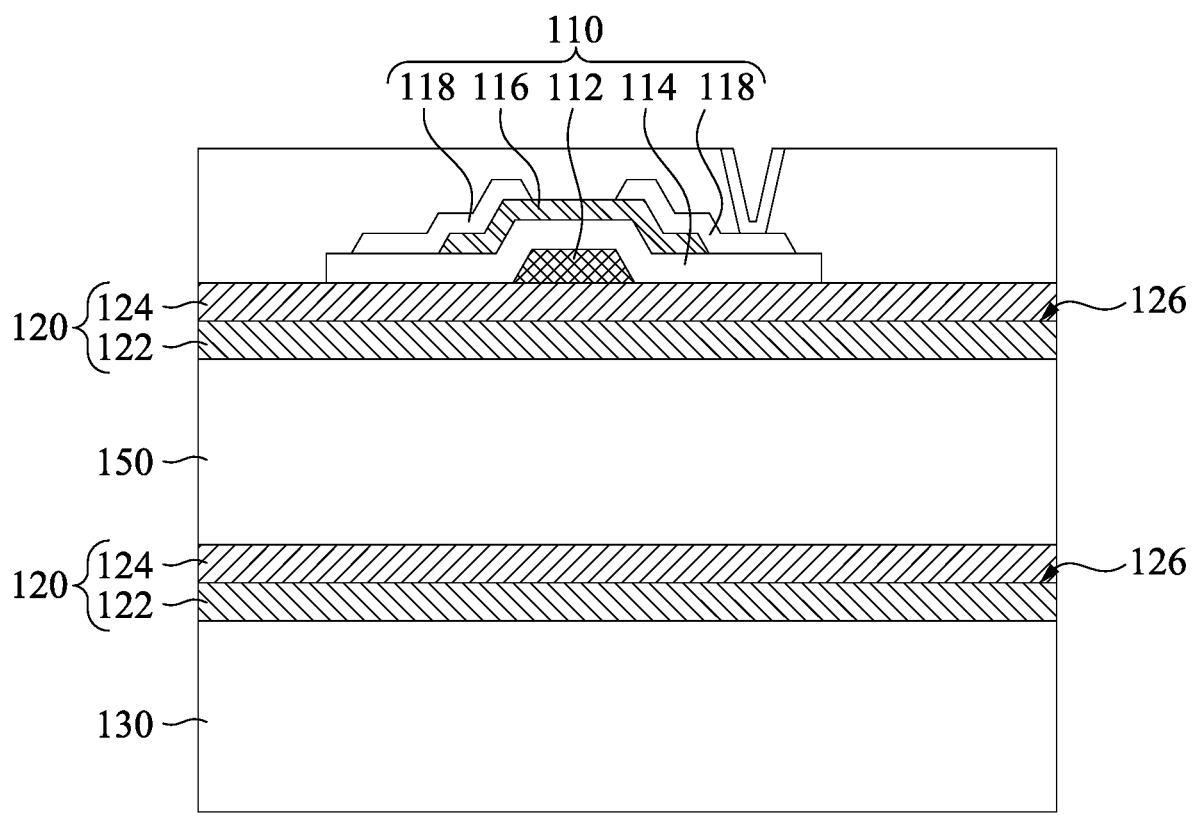
FIG. 4 is a cross-sectional view of a display device according to another embodiment of the present disclosure.

FIG. 4 is a cross-sectional view of a display device 100b according to another embodiment of the present disclosure. The display device 100b is substantially the same as the display device 100a shown in FIG. 3, the difference is that the display device 100b further includes another optical blocking layer 120 located between the flexible substrate 130 and the pixel array 110. It is noted that, in the present embodiment, there may be a steam blocking layer 140 as shown in FIG. 3. For example, a steam blocking layer may be located between the pixel array 110 and the optical blocking layer 120, and the optical blocking layer 120 covers the entire bottom surface of the steam blocking layer. As described above, the combination of the optical blocking layer 120 and the flexible substrate 130 can be considered as a substrate with high reflective rate. Specifically, in order to makes the display device 100b be flexible, the thickness of the flexible substrate 130 is usually in a range from about 35 micrometers to 45 micrometers. However, when the requirement for the mechanism property of the display device is higher, the composite structure composed by the optical blocking layer 120 and the flexible substrate 130 can be layered repeated so as to reach the requirement. As such, the ability of reflecting the laser light L can be enhanced while the mechanism property of the display device 100b is improved. In addition, the complexity of the process will not be increased.

Figure 5:
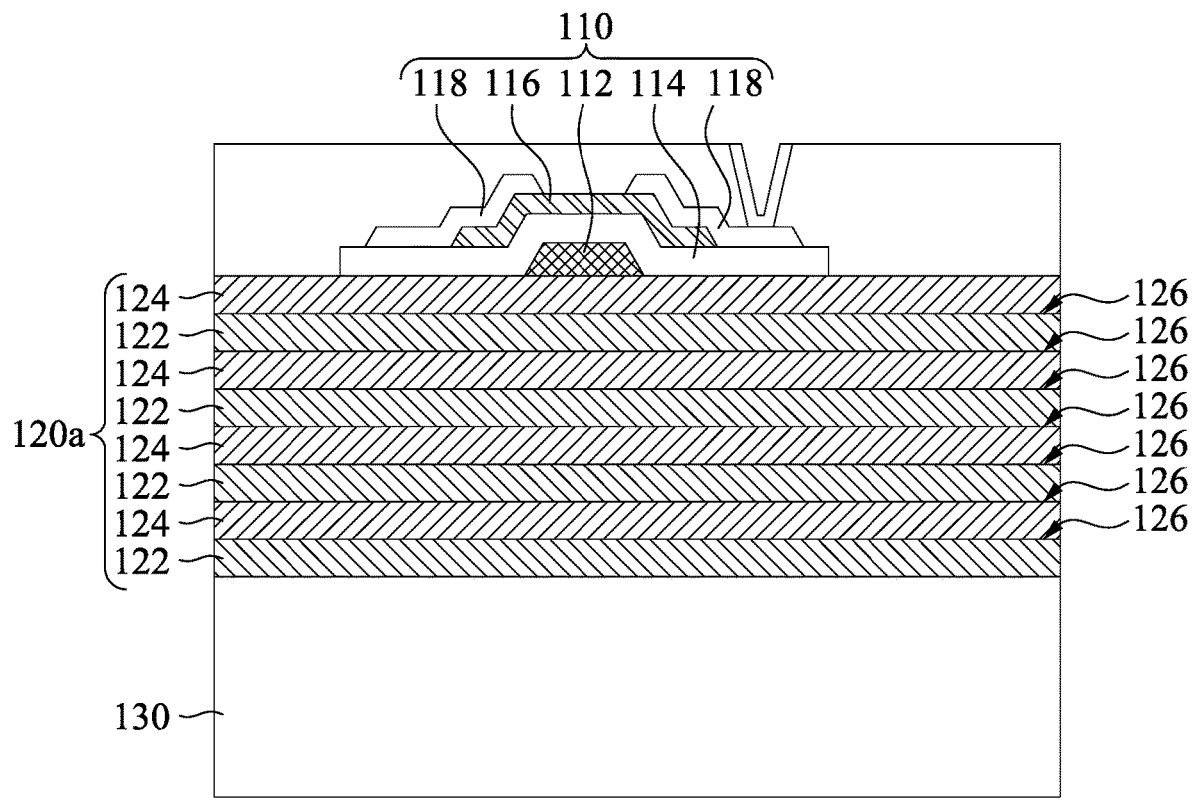
FIG. 5 is a cross-sectional view of a display device according to another embodiment of the present disclosure.

FIG. 5 is a cross-sectional view of a display device 100c according to another embodiment of the present disclosure. The display device 100c is substantially the same as the display device 100 shown in FIG. 1, the difference is that the optical blocking layer 120a of the display device 100c has plural first sub-layers 122 and plural second sub-layers 124. The first sub-layers 122 and the second sub-layers 124 are alternately arranged. The refractive index of the first sub-layers 122 is smaller than the refractive index of the second sub-layers 124. In other words, the optical blocking layer 120a can be considered as a structure formed by four groups of optical blocking layer 120 shown in the display device 100. Specifically, the greater the difference between the refractive index of the first sub-layers 122 and the second sub-layers 124, the better the ability of the optical blocking layer 120a to reflect the light. In addition, the more the layers of the optical blocking layer 120a, the better the ability of the optical blocking layer 120a to reflect the light. Therefore, in the embodiment shown in FIG. 5, the laser light L may be reflected when passing through seven interfaces 126 with large difference of the refractive index and passing through the interface between the opening of the flexible substrate 150 and the first sub-layer 122, thereby enhancing the ability of the optical blocking layer 120a to reflect the light. As such, the pixel array 110 can be prevented from being lightened by the laser light L, thereby enhance yield of the display device 100. The aforementioned parameters such as the refractive index, the thickness, the wavelength of the laser light, and the number of the layers of the stack may be adjusted depending on practical requirement, and the present disclosure is not limited in this regard.

As described above, through disposing an optical blocking layer with higher refractive index between the pixel array and the flexible substrate, the array pixel may be prevented from being damaged by the laser light when the flexible substrate and the glass substrate are separated through the laser light.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display device, comprising:
   a pixel array;
   a first flexible substrate and a second flexible substrate located below the pixel array; and
   a first optical blocking layer and a second optical blocking layer, wherein the first optical blocking layer is located between the first flexible substrate and the pixel array, the second optical blocking layer is located between the second flexible substrate and the pixel array, wherein each of the first optical blocking layer and the second optical blocking layer includes a first sub-layer and a second sub-layer, the first sub-layer of the first optical blocking layer is located between the second sub-layer of the first optical blocking layer and the first flexible substrate, the first sub-layer of the second optical blocking layer is located between the second sub-layer of the second optical blocking layer and the second flexible substrate, and a refractive index of the first sub-layers are smaller than a refractive index of the second sub-layers.

2. The display device of claim 1, wherein an orthogonal projection of the first optical blocking layer on the first flexible substrate is overlapped with the entirety of an orthogonal projection of the pixel array on the first flexible substrate.

3. The display device of claim 1, wherein the first optical blocking layer covers the entirety of the first flexible substrate.

4. The display device of claim 1, wherein the first optical blocking layer is directly in contact with the first flexible substrate.

5. The display device of claim 1, further comprising:
a steam blocking layer located between the pixel array and the first optical blocking layer, and the first optical blocking layer covers the entirety of an bottom surface of the steam blocking layer.

6. The display device of claim 5, wherein an orthogonal projection of the first optical blocking layer on the first flexible substrate is overlapped with the entirety of an orthogonal projection of the steam blocking layer on the first flexible substrate.

7. The display device of claim 1, further comprises:
a steam blocking layer located between the pixel array and one of the first flexible substrates and the second flexible substrates, and the first flexible substrate and the second flexible substrate are respectively located at two opposite sides of the first optical blocking layer.

8. The display device of claim 7, wherein an orthogonal projection of the first optical blocking layer on the first flexible substrates is overlapped with the entirety of an orthogonal projection of the second flexible substrate located between the steam blocking layer and the first optical blocking layer on the first flexible substrates.

9. The display device of claim 7, wherein an orthogonal projection of the first optical blocking layer on the second flexible substrate is overlapped with the entirety of an orthogonal projection of the steam blocking layer on the second flexible substrate.

10. The display device of claim 1, wherein each of the first optical blocking layer and the second optical blocking layer includes a plurality of first sub-layers and a plurality of second sub-layers, and the first sub-layers and the second sub-layers are alternately arranged.

\* \* \* \* \*